(12) United States Patent
Kamal et al.

(10) Patent No.: US 7,209,007 B1
(45) Date of Patent: Apr. 24, 2007

(54) COMBINED ANALOG SIGNAL GAIN CONTROLLER AND EQUALIZER

(75) Inventors: Abu-Hena Mostafa Kamal, Santa Clara, CA (US); Jitendra Mohan, Santa Clara, CA (US); Yongseon Koh, Palo Alto, CA (US)

(73) Assignee: National Semiconductor Corporation, Sunnyvale, CA (US)

( * ) Notice: Subject to any disclaimer, the term of this patent is extended or adjusted under 35 U.S.C. 154(b) by 123 days.

(21) Appl. No.: 11/161,504

(22) Filed: Aug. 5, 2005

(51) Int. Cl.
*H03F 3/04* (2006.01)

(52) U.S. Cl. .................. 330/304; 330/254; 330/260
(58) Field of Classification Search ............. 330/304, 330/254, 260
See application file for complete search history.

(56) References Cited

U.S. PATENT DOCUMENTS

| | | | |
|---|---|---|---|
| 4,262,260 A * | 4/1981 | Tamura | 330/109 |
| 4,313,288 A * | 2/1982 | Tassi et al. | 53/74 |
| 5,455,843 A | 10/1995 | Cherubini et al. | |
| 5,712,591 A * | 1/1998 | Maag et al. | 330/84 |
| 5,841,810 A | 11/1998 | Wong et al. | |
| 6,212,831 B1 * | 4/2001 | White | 52/169.14 |
| 8,492,876 | 12/2002 | Kamal et al. | |
| 6,545,534 B1 * | 4/2003 | Mehr | 330/69 |
| 6,545,622 B1 | 4/2003 | Kamal et al. | |

OTHER PUBLICATIONS

Babanezhad, Joseph., A 3.3V Analog Adaptive Line-Equalizer For Fast Ethernet Data Communication, 1998, pp. 343-346 IEEE 1998 Custom Integrated Circuits Conference.

* cited by examiner

*Primary Examiner*—Patricia Nguyen
(74) *Attorney, Agent, or Firm*—Vedder, Price, Kaufman & Kammholz, P.C.

(57) ABSTRACT

An analog signal gain controller and equalizer with an increased signal bandwidth for reducing intersymbol interference (ISI) within a digital data signal.

14 Claims, 1 Drawing Sheet

COMBINED ANALOG SIGNAL GAIN CONTROLLER AND EQUALIZER

BACKGROUND OF THE INVENTION

The present invention relates to analog signal gain adjustment and equalization, in particular, to analog signal gain controllers and equalizers that adaptively compensate for analog signal distortions due to analog signal transmission through a cable.

As is well-known, data communication via Ethernet (e.g., 100 Mb and 1 Gb per second) is accomplished by transmitting and receiving data bits as analog signals over cables such as category 5 (CAT5) unshielded twisted pair (UTP), with the receiver recovering the digital data bits and clock from the transmitted analog signal. The signals containing the data are typically distorted in signal gain and phase as they are transmitted over long cable lengths at high frequencies. The received signal usually has a higher amplitude than that for which the receiver circuitry is designed. Accordingly, an automatic gain control (AGC) circuit lowers the gain to a level so that the data processing in subsequent circuit stages, such as an equalizer and analog-to-digital converter (ADC), can be done at lower signal levels, and thus at lower power. Additionally, the channel distortion must be equalized or otherwise corrected so as to allow the data clock signal to be properly recovered from the received signal, thereby minimizing the bit error rate (BER) associated with the recovered data.

Such signal equalization is typically done prior to clock or data recovery, with the equalization compensating for the cable loss by reshaping the signal to be closer to its original waveform to minimize intersymbol interface (ISI) within the recovered data signal.

Cable dispersion loss is generally linearly proportional to the cable length and to the square root of the data rate, thereby making the maximum data rate or transmission frequency dependent upon the cable length. Accordingly, as is well known in the art, an adaptive equalizer synthesizes a frequency response that is inversely proportional to the frequency response of the cable. Various adaptive signal equalizers have been developed, including those described in U.S. Pat. Nos. 5,455,843, 5,841,810, 6,545,622, and 6,492,876, the disclosures of which are incorporated herein by reference.

SUMMARY OF INVENTION

In accordance with the presently claimed invention, an analog signal gain controller and equalizer is provided with an increased signal bandwidth for reducing intersymbol interference (ISI) within a digital data signal.

In accordance with one embodiment of the presently claimed invention, an analog signal equalizer includes, at least in part, an input signal electrode, operational amplifier circuitry and first equalization circuitry. The input signal electrode is to convey a first input analog signal VI1. The operational amplifier circuitry includes first and second input electrodes and first and second output electrodes, wherein the first operational amplifier circuitry output electrode is to convey a first output analog signal VO1, and a ratio VO1/VI1 of the first output and input analog signals is proportional to frequency. The first equalization circuitry is coupled to the first input signal electrode and the first operational amplifier circuitry. The first equalization circuitry includes: a first feedback impedance network coupled between the first operational amplifier circuitry input and output electrodes; a first input impedance network coupled to the first input signal electrode and having an impedance magnitude inversely proportional to frequency; a first input resistance coupled in parallel with the first input impedance network; and first input signal summing circuitry coupled between the first input impedance network and the first operational amplifier circuitry input electrode.

In accordance with another embodiment of the presently claimed invention, an analog signal equalizer includes, at least in part, operational amplifier means and first equalizer means. The operational amplifier means is for amplifying a first intermediate analog signal to provide a first output analog signal VO1. The first equalizer means is for receiving a first input analog signal VI1 and in response thereto providing the first intermediate analog signal, wherein a ratio VO1/VI1 of the first output and input analog signals is proportional to frequency, and the first equalizer means includes first feedback impedance means for feeding back at least a portion of the first output analog signal VO1, first input impedance means for conveying at least a first portion of the first input analog signal VI1 with an impedance magnitude inversely proportional to frequency, first input resistance means for resistively conveying at least a second portion of the first input analog signal VI1, and first input signal summing means for summing at least the first and second portions of the first input analog signal VI1 to provide the first intermediate analog signal.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators.

Figure 1:
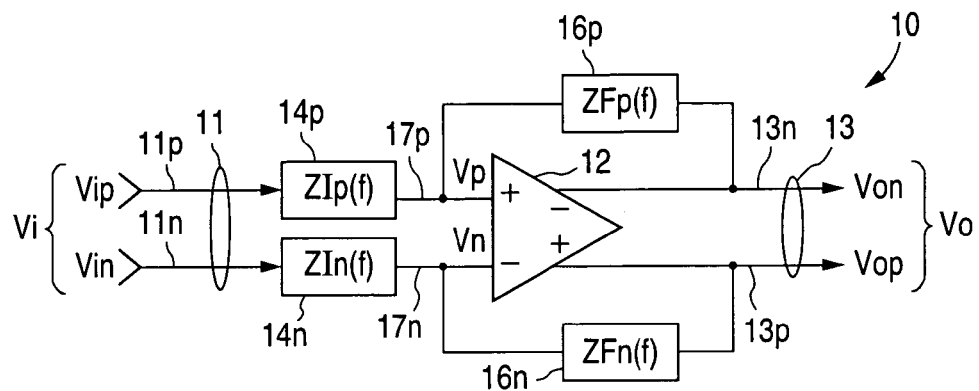
FIG. 1 is a schematic diagram of a combined analog signal gain controller and equalizer in accordance with one embodiment of the presently claimed invention.

Referring to FIG. 1, an analog signal gain controller and equalizer 10 in accordance with one embodiment of the presently claimed invention includes an operational amplifier circuit 12, input impedance networks 14p, 14n, and feedback impedance networks 16p, 16n, all interconnected substantially as shown. The operational amplifier circuit 12 is fully differential i.e., both the input and output signals are differential. Accordingly, two input impedance networks and two feedback impedance networks are used, as shown, to accommodate the differential input signal 11, having positive 11p and negative 11n signal phases, to provide the differential output signal 13, having positive 13p and negative 13n signal phases.

Figure 2:
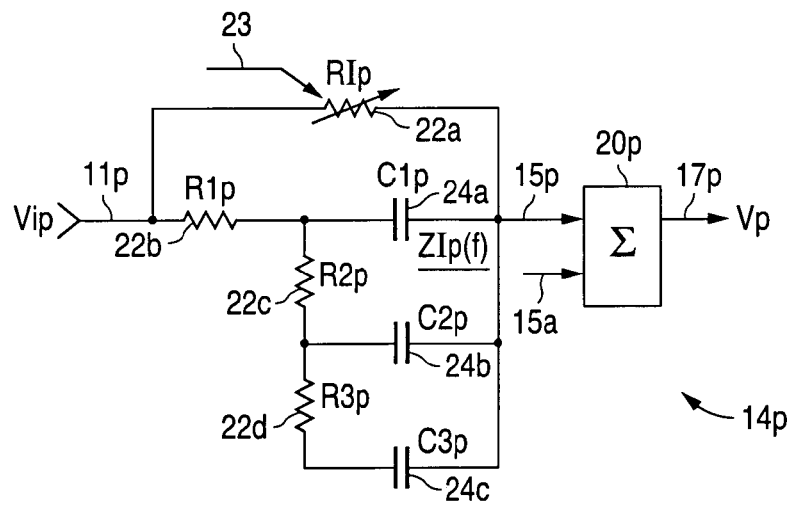
FIG. 2 is a schematic diagram of the input impedance circuitry for the circuit of FIG. 1.

Referring to FIG. 2, in accordance with a preferred embodiment, each of the input impedance networks 14p and 14n, one of which is depicted here, includes a resistance 22a (having a resistance value RIp) coupled in parallel with an impedance network implemented with additional resistances 22b, 22c, 22d and capacitances 24a, 24b, 24c, interconnected as shown. This network of resistors 22b, 22c, 22d and capacitors 24a, 24b and 24c collectively have an impedance ZIp(f) having an impedance magnitude inversely proportional to frequency, thereby serving as a high pass filter. In accordance with techniques well-known in the art, the resistances 22a, 22b, 22c, 22d and capacitances 24a, 24b, 24c can easily be implemented in integrated circuit form (e.g., using appropriately biased or connected metal oxide semiconductor field effect transistors). The primary resistance 22a can be made variable through the use of an appropriate control signal 23 (e.g., a digitally controlled analog signal having a variable magnitude for controlling the bias of the device(s) used to implement the resistance 22a). Additionally, a more complex impedance network can be implemented using additional resistances and capacitances coupled in a manner similar to that shown.

The output signal 15p from this impedance network goes to a summing circuit 20p (preferably an active summing circuit, many types of which are well-known in the art), which provides the signal 17p for the operation amplifier circuit 12 (FIG. 1). The use of this summing circuit 20p provides isolation between its input 15p and output 17p signals, and also allows an additional 15a to be introduced via summation with the primary input signal 15p. Such additional input signal 15A can be another signal, compensated in a manner similar to the primary compensated signal 15p, from elsewhere within the receiver. For example, the primary compensated signal 15p can be the data signal within the receiver circuitry, while the additional compensated signal 15a can be a data signal originating within the transmitter circuitry.

Figure 3:
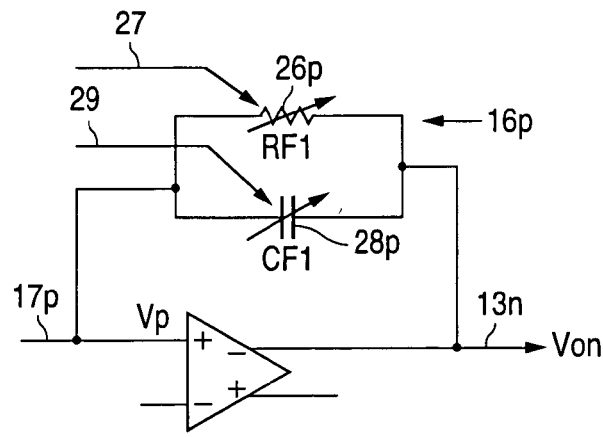
FIG. 3 is a schematic diagram of the feedback impedance circuitry for the circuit of FIG. 1.

Referring to FIG. 3 a preferred embodiment of the feedback impedance networks includes a variable resistance 26p (having a resistance value RF1) coupled in parallel with a variable capacitance 28p (having a capacitance value CF1). For purposes of the adaptive equalization process, control signals 27, 29 are used to control the variable resistance and capacitance values of the feedback resistance 26p and capacitance 28p (e.g., digitally controlled analog signals for controlling the respective biasing levels of the devices used to implement the resistance 26p and capacitance 28p).

Using the input 14 and feedback 16 impedance networks discussed above in connection with FIGS. 2 and 3, it can be shown that the signal transfer characteristic from the input to the output, e.g., a ratio of the corresponding output and input voltages can be expressed as follows:

$$Von/VIp=(-RF1/RIp)*(1+RIp/ZIp(f))/(1+RF1*S*CF1)$$

The factor RF1/RIp defines the AGC function, while the factor RIp/ZIp(f) defines the adaptive equalization boost.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including an analog signal gain controller and equalizer, at least a portion of which comprises:
   a first input signal electrode to convey a first input analog signal VI1;
   operational amplifier circuitry including first and second input electrodes and first and second output electrodes, wherein said first operational amplifier circuitry output electrode is to convey a first output analog signal VO1, and a ratio VO1/VI1 of said first output and input analog signals is proportional to frequency; and
   first equalization circuitry coupled to said first input signal electrode and said first operational amplifier circuitry, wherein said first equalization circuitry includes
      a first feedback impedance network coupled between said first operational amplifier circuitry input and output electrodes,
      a first input impedance network coupled to said first input signal electrode and having an impedance magnitude inversely proportional to frequency,
      a first input resistance coupled in parallel with said first input impedance network, and
      first input signal summing circuitry coupled between said first input impedance network and said first operational amplifier circuitry input electrode.

2. The apparatus of claim 1, wherein said first feedback impedance network comprises, mutually coupled in parallel, a first feedback resistance and a first feedback capacitance.

3. The apparatus of claim 2, wherein said ratio VO1/VI1 of said first output and input analog signals is expressed substantially as VO1/VI1=(−RF1/RI1)*(1+RI1/ZI1(f))/(1+RF1*S*CF1), wherein RF1 is a resistance value of said first feedback resistance, RI1 is a resistance value of said first input resistance, ZI1(f) is an impedance value of said first input impedance network as a function of frequency f, and CF1 is a capacitance value of said first feedback capacitance.

4. The apparatus of claim 3, wherein said first feedback resistance value RF1 is variable and said first feedback capacitance value CF1 is variable.

5. The apparatus of claim 1, wherein said first input impedance network comprises a network of mutually coupled pluralities of resistances and capacitances.

6. The apparatus of claim 1, wherein said first input signal summing circuitry comprises first active signal summing circuitry.

7. The apparatus of claim 1, further comprising:
   a second input signal electrode to convey a second input analog signal VI2; and
   second equalization circuitry coupled to said first input signal electrode and said second operational amplifier circuitry, wherein said second operational amplifier circuitry output electrode is to convey a second output analog signal VO2, a ratio VO2/VI2 of said second output and input analog signals is proportional to frequency, and said second equalization circuitry includes
- a second feedback impedance network coupled between said second operational amplifier circuitry input and output electrodes,
- a second input impedance network coupled to said second input signal electrode and having an impedance magnitude inversely proportional to frequency,
- a second input resistance coupled in parallel with said second input impedance network, and
- second input signal summing circuitry coupled between said second input impedance network and said second operational amplifier circuitry input electrode.

8. The apparatus of claim 7, wherein:
said first feedback impedance network comprises, mutually coupled in parallel, a first feedback resistance and a first feedback capacitance; and
said second feedback impedance network comprises, mutually coupled in parallel, a second feedback resistance and a second feedback capacitance.

9. The apparatus of claim 8, wherein:
said ratio VO1/VI1 of said first output and input analog signals is expressed substantially as $VO1/VI1=(-RF1/RI1)*(1+RI1/ZI1(f))/(1+RF1*S*CF1)$, wherein RF1 is a resistance value of said first feedback resistance, RI1 is a resistance value of said first input resistance, $ZI1(f)$ is an impedance value of said first input impedance network as a function of frequency f, and CF1 is a capacitance value of said first feedback capacitance; and
said ratio VO2/VI2 of said second output and input analog signals is expressed substantially as $VO2/VI2=(-RF2/RI2)*(1+RI2/ZI2(f))/(1+RF2*S*CF2)$, wherein RF2 is a resistance value of said second feedback resistance, RI2 is a resistance value of said second input resistance, $ZI2(f)$ is an impedance value of said second input impedance network as a function of frequency f, and CF2 is a capacitance value of said second feedback capacitance.

10. The apparatus of claim 9, wherein said first feedback resistance value RF1 is variable, said first feedback capacitance value CF1 is variable, said second feedback resistance value RF2 is variable and said second feedback capacitance value CF2 is variable.

11. The apparatus of claim 7, wherein:
said first input impedance network comprises a first network of mutually coupled pluralities of resistances and capacitances; and
said second input impedance network comprises a second network of mutually coupled pluralities of resistances and capacitances.

12. The apparatus of claim 7, wherein:
said first input signal summing circuitry comprises first active signal summing circuitry; and
said second input signal summing circuitry comprises second active signal summing circuitry.

13. An apparatus including an analog signal gain controller and equalizer, at least a portion of which comprises:
operational amplifier means for amplifying a first intermediate analog signal to provide a first output analog signal VO1; and
first equalizer means for receiving a first input analog signal VI1 and in response thereto providing said first intermediate analog signal, wherein a ratio VO1/VI1 of said first output and input analog signals is proportional to frequency, and said first equalizer means includes
- first feedback impedance means for feeding back at least a portion of said first output analog signal VO1,
- first input impedance means for conveying at least a first portion of said first input analog signal VI1 with an impedance magnitude inversely proportional to frequency,
- first input resistance means for resistively conveying at least a second portion of said first input analog signal VI1, and
- first input signal summing means for summing at least said first and second portions of said first input analog signal VI1 to provide said first intermediate analog signal.

14. The apparatus of claim 13, wherein said operational amplifier means is further for amplifying a second intermediate analog signal to provide a second output analog signal VO2, and further comprising second equalizer means for receiving a second input analog signal VI2 and in response thereto providing said second intermediate analog signal, wherein a ratio VO2/VI2 of said second output and input analog signals is proportional to frequency, and said second equalization circuitry includes:
second feedback impedance means for feeding back at least a portion of said second output analog signal VO2;
second input impedance means for conveying at least a first portion of said second input analog signal VI2 with an impedance magnitude inversely proportional to frequency;
second input resistance means for resistively conveying at least a second portion of
said second input analog signal VI2; and
second input signal summing means for summing at least said first and second portions of said second input analog signal VI2 to provide said second intermediate analog signal.

* * * * *